(12) United States Patent
Hill et al.

(10) Patent No.: US 8,766,210 B2
(45) Date of Patent: Jul. 1, 2014

(54) VARIABLE ENERGY CHARGED PARTICLE SYSTEMS

(75) Inventors: Raymond Hill, Rowley, MA (US); John Notte, IV, Gloucester, MA (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 0 days.

(21) Appl. No.: 13/328,326

(22) Filed: Dec. 16, 2011

(65) Prior Publication Data
US 2012/0138815 A1 Jun. 7, 2012

Related U.S. Application Data

(63) Continuation of application No. PCT/US2010/048877, filed on Sep. 15, 2010.

(60) Provisional application No. 61/247,311, filed on Sep. 30, 2009.

(51) Int. Cl.
*H01J 49/10* (2006.01)
*H01J 27/02* (2006.01)
*H01J 27/26* (2006.01)

(52) U.S. Cl.
USPC .............. 250/423 F; 250/423 R; 250/492.2; 250/426; 250/492.21

(58) Field of Classification Search
USPC .............. 250/423 R, 423 F, 311, 492.21
See application file for complete search history.

(56) References Cited

U.S. PATENT DOCUMENTS

| | | | |
|---|---|---|---|
| 4,142,133 A | 2/1979 | Balandin et al. | |
| 4,831,308 A * | 5/1989 | Konishi et al. | 313/362.1 |
| 7,067,829 B2 * | 6/2006 | Richards et al. | 250/492.21 |
| 7,504,639 B2 | 3/2009 | Ward et al. | |
| 7,554,097 B2 * | 6/2009 | Ward et al. | 250/423 F |
| 7,557,358 B2 * | 7/2009 | Ward et al. | 250/423 F |
| 7,557,359 B2 * | 7/2009 | Ward et al. | 250/423 F |
| 7,557,361 B2 * | 7/2009 | Ward et al. | 250/423 F |
| 7,601,953 B2 * | 10/2009 | Ward et al. | 250/309 |
| 7,786,451 B2 * | 8/2010 | Ward et al. | 250/423 F |
| 7,786,452 B2 * | 8/2010 | Ward et al. | 250/423 F |
| 8,110,814 B2 * | 2/2012 | Ward et al. | 250/423 F |
| 8,115,184 B2 * | 2/2012 | Shichi et al. | 250/492.21 |
| 8,227,753 B2 * | 7/2012 | Notte et al. | 250/307 |
| 8,334,701 B2 * | 12/2012 | Knippelmeyer et al. | 324/537 |

(Continued)

FOREIGN PATENT DOCUMENTS

| | | |
|---|---|---|
| EP | 0 658 914 | 6/1995 |
| EP | 2 068 343 | 6/2009 |
| JP | 63 414247 | 6/1988 |

OTHER PUBLICATIONS

The International Search Report and a Written Opinion from the counterpart PCT Application No. PCT/US2010/048877, dated Nov. 8, 2010.

(Continued)

*Primary Examiner* — Nikita Wells
*Assistant Examiner* — Johnnie L Smith
(74) *Attorney, Agent, or Firm* — Fish & Richardson P.C.

(57) ABSTRACT

Charged particle system are disclosed and include a first voltage source, a second voltage source electrically isolated from the first voltage source, a charged particle source electrically connected to the first voltage source, and an extractor electrically connected to the second voltage source. Methods relating to the charged particle systems are also disclosed.

29 Claims, 4 Drawing Sheets

(56) References Cited

U.S. PATENT DOCUMENTS

| | | |
|---|---|---|
| 2006/0108544 A1 | 5/2006 | Richards et al. |
| 2007/0138388 A1* | 6/2007 | Ward et al. .................... 250/288 |
| 2007/0158555 A1* | 7/2007 | Ward et al. .................... 250/309 |
| 2007/0158556 A1* | 7/2007 | Ward et al. .................... 250/309 |
| 2007/0158557 A1* | 7/2007 | Ward et al. .................... 250/309 |
| 2007/0158558 A1* | 7/2007 | Ward et al. .................... 250/309 |
| 2007/0158580 A1* | 7/2007 | Ward et al. .................... 250/426 |
| 2007/0158581 A1* | 7/2007 | Ward et al. .................... 250/426 |
| 2007/0158582 A1* | 7/2007 | Ward et al. .................... 250/426 |
| 2007/0187621 A1* | 8/2007 | Ward et al. ............... 250/492.21 |
| 2007/0194226 A1* | 8/2007 | Ward et al. .................... 250/309 |
| 2007/0194251 A1* | 8/2007 | Ward et al. ............... 250/492.21 |
| 2007/0205375 A1* | 9/2007 | Ward et al. .................... 250/398 |
| 2007/0210250 A1* | 9/2007 | Ward et al. .................... 250/307 |
| 2007/0221843 A1* | 9/2007 | Ward et al. .................... 250/309 |
| 2007/0235646 A1* | 10/2007 | Tanii et al. .................... 250/311 |
| 2009/0146074 A1* | 6/2009 | Banzhof et al. ........... 250/396 R |
| 2009/0152462 A1 | 6/2009 | Ishitani et al. |
| 2010/0012837 A1* | 1/2010 | Notte et al. .................... 250/307 |

OTHER PUBLICATIONS

The Written Opinion of the International Preliminary Examining Authority for corresponding PCT Appl No. PCT/US2010/048877, dated Dec. 9, 2011.

\* cited by examiner

VARIABLE ENERGY CHARGED PARTICLE SYSTEMS

CROSS-REFERENCE TO RELATED APPLICATIONS

This application is a continuation of, and claims benefit under 35 USC 120 to, international application PCT/US2010/048877, filed Sep. 15, 2010, which claims benefit under 35 USC 119(e) of U.S. Ser. No. 61/247,311, filed Sep. 30, 2009. International application PCT/US2010/048877 is hereby incorporated by reference in its entirety.

TECHNICAL FIELD

This disclosure relates to charged particle sources and systems.

BACKGROUND

Charged particle sources and systems can be used for various applications including measurement of sample properties and sample modification. A charged particle source typically produces a beam of charged particles that is directed by other system components to be incident on a sample.

SUMMARY

In general, in a first aspect, the disclosure features charged particle systems that include a first voltage source, a second voltage source electrically isolated from the first voltage source, a charged particle source electrically connected to the first voltage source, and an extractor electrically connected to the second voltage source.

In another aspect, the disclosure features methods that include applying a first voltage from a first voltage source to a charged particle source, and applying a second voltage from a second voltage source electrically isolated from the first voltage source to an extractor, where the first and second voltages are selected to generate a plurality of charged particles and to cause the plurality of charged particles to leave the charged particle source.

In a further aspect, the disclosure features methods that include applying a first voltage from a first voltage source to a charged particle source, and applying a second voltage from a second voltage source electrically isolated from the first voltage source to an extractor, where the first and second voltages are selected to control one or more properties of charged particles generated by the charged particle source.

Embodiments can include one or more of the following features.

The charged particle systems can include a third voltage source electrically isolated from the first and second voltage sources, and a sample stage electrically connected to the third voltage source, where the first voltage source is configured to apply a first voltage to the charged particle source to cause a plurality of charged particles having a first average energy to leave the tip, the second voltage source is configured to apply a second voltage to the extractor, and the third voltage source is configured to apply a third voltage to a sample positioned on the sample stage so that the charged particles have a second average energy different from the first average energy when they are incident on the sample. The third voltage can be selected so that the second average energy is less than the first average energy.

The first voltage can be positive relative to a common electrical ground. The second voltage can be less positive than the first voltage relative to the common electrical ground. The second voltage can be negative relative to the common electrical ground. The first and second voltages can be selected so that an electric field in the vicinity of the charged particle source is directed radially outward from the charged particle source.

The charged particle systems can include an electronic processor connected to the third voltage source and configured to select the third voltage. The charged particle systems can include a detector connected to the electronic processor and configured to determine an average energy of the particles when they are incident on the sample. The electronic processor can be configured to select the third voltage based on the determined average energy of the particles.

The charged particle source can be configured to produce a plurality of charged particles that comprise ions. The ions can include noble gas ions (e.g., helium ions and/or argon ions and/or neon ions and/or krypton ions). The charged particle source can be a gas field ion source.

The first voltage source can be configured to apply a first voltage to the charged particle source and the second voltage source can be configured to apply a second voltage to the extractor, and the first and second voltage sources can be configured so that during operation, if the magnitude of one of the first or second voltages is reduced, the charged particle source does not emit electrons. The first and second voltage sources can be configured so that during operation, if the magnitude of one of the first or second voltages is reduced to zero, the charged particle source does not emit electrons.

The first voltage source can be configured to apply a first voltage to the charged particle source and the second voltage source can be configured to apply a second voltage to the extractor, and the first and second voltage sources can be configured so that during operation, if the magnitude of one of the first or second voltages is reduced, the charged particle source does not melt or vaporize. The first and second voltage sources can be configured so that during operation, if the magnitude of one of the first or second voltages is reduced to zero, the charged particle source does not melt or vaporize.

The first voltage source can be configured to apply a first voltage to the charged particle source and the second voltage source can be configured to apply a second voltage to the extractor, and the first and second voltage sources can be configured so that during operation, if the magnitude of one of the first or second voltages is reduced, an electric field in the vicinity of the charged particle source remains directed away from the charged particle source.

The first voltage source can be configured to apply a first voltage to the charged particle source and the second voltage source can be configured to apply a second voltage to the extractor, and the first and second voltage sources can be configured so that during operation, if the magnitude of one of the first or second voltages is reduced, a voltage of the charged particle source remains positive relative to a voltage of the extractor.

The charged particle systems can include an electronic processor configured to control the first and second voltage sources so that the first voltage is more positive than the second voltage, relative to a common electrical ground. The electronic processor can be configured to maintain the first voltage at a positive voltage value relative to the common electrical ground, and to maintain the second voltage at a negative voltage value relative to the common electrical ground.

The charged particles can have a first average energy when they leave the charged particle source, and the methods can include applying a third voltage from a third voltage source to a sample so that the charged particles have a second average energy different from the first average energy when they are incident on the sample. The second average energy can be less than the first average energy. The third voltage source can be electrically isolated from the first and second voltage sources. The first voltage can be positive relative to a common electrical ground and the second voltage can be negative relative to the common electrical ground. The first and second voltages can be selected so that an electric field in the vicinity of the charged particle source is directed radially outward from the charged particle source.

The methods can include determining an average energy of the charged particles when they are incident on the sample, and selecting the third voltage based on the determination of the average energy.

A difference between the first and second voltages can be 15 kV or more (e.g., 25 kV or more). The first average energy can be 25 keV or more (e.g., 50 keV or more). The second average energy can be 15 keV or less (e.g., 5 keV or less).

The one or more properties can include at least one member selected from the group consisting of a charged particle current, an emission pattern of the charged particles from the charged particle source, and an energy distribution of the charged particles.

The methods can include selecting the first and second voltages so that the first voltage is more positive than the second voltage relative to a common electrical ground. The methods can include selecting the first and second voltages so that the first voltage is positive with respect to a common electrical ground and the second voltage is negative with respect to the common electrical ground. The methods can include selecting the first and second voltages so that an electric field in the vicinity of the charged particle source is directed radially outward from the charged particle source. The methods can include selecting the first and second voltages so that the electric field in the vicinity of the charged particle source remains directed radially outward if a magnitude of one of the first and second voltages is reduced. The magnitude of one of the first and second voltages can be reduced due to a failure of one of the first and second voltage sources. The magnitude of one of the first and second voltages can be reduced due to a failure of an electrical insulator.

The charged particle source and the extractor can form a portion of a gas field ion source.

Embodiments can include one or more of the following advantages.

In some embodiments, the use of uncoupled power supplies ensures that if a power supply fails, the tip does not enter an electron emission operating regime. This can be particularly important for a tip that is used to generate positively charged particles. By preventing electron emission from the tip, tip heating does not occur and the likelihood of melting and/or vaporization of the tip is reduced. For a tip that is used to generate negatively charged particles, the use of uncoupled power supplies ensures that if a power supply fails, the tip does not enter a regime of operation where excessive—or very high current—electron emission occurs. As above, very high current electron emission can lead to melting and/or vaporization of the tip. The use of uncoupled power supplies, as disclosed herein, can be used to reduce the likelihood of such damage in electron sources.

In certain embodiments, the voltages applied to the tip, extractor, and first lens can be independently adjusted. Accordingly, the final energy of the charged particles can be reliably controlled, permitting operator selection of the charged particle energy according to one or more different applications. As different applications benefit from different charged particle energies, this enables use of the charged particle sources and systems in a wide variety of different applications.

In some embodiments, the final charged particle energy can be automatically maintained. The sources and systems disclosed herein include an electronic processor configured so that a system operator can select a desired average particle energy, and the electronic processor can automatically adjust the voltages applied to various system components to maintain the selected particle energy.

The details of one or more embodiments are set forth in the accompanying drawings and the description below. Other features and advantages will be apparent from the description, drawings, and claims.

DESCRIPTION OF DRAWINGS

Like reference symbols in the various drawings indicate like elements.

DETAILED DESCRIPTION

When a charged particle beam interacts with a sample, many different sample interactions and responses depend in part on the average energy of the charged particles. For example, for relatively high energy ion beams (e.g., at energies of between 50 keV and 100 keV), a larger number of secondary electrons are liberated as the charged particles are incident on the sample. Further, at relatively high energies, charged particle beams can typically be focused to smaller spot sizes on the surface of a sample (e.g., spot sizes of 2.5 Angstroms or less, 2.0 Angstroms or less, 1.5 Angstroms or less, or even less). Even further, higher energy beams are less affected by stray magnetic fields, and cause less surface damage to samples because the rate at which particles are sputtered from the sample surface (e.g., particularly for ion beams) at higher beam energy is reduced.

Relatively low energy charged particle beams also provide certain advantages in some applications. For example, at relatively low average beam energies (e.g., 20 keV or less, 15 keV or less, 10 keV or less, 5 keV or less, 1 keV or less), the rate of sample sputtering (e.g., particularly for certain ion beams) is increased, which is useful for applications that involve sample modification. At relatively low energies, the number of dislocated atoms in a sample resulting from beam exposure is reduced relative to higher energy beams, ensuring that fewer imperfections are introduced into the bulk sample structure by the exposure. Further, at lower beam energies, the backscatter rate of the incident charged particles is typically lower, which can be advantageous both for sample modification applications and certain types of sample measurements.

Figure 1:
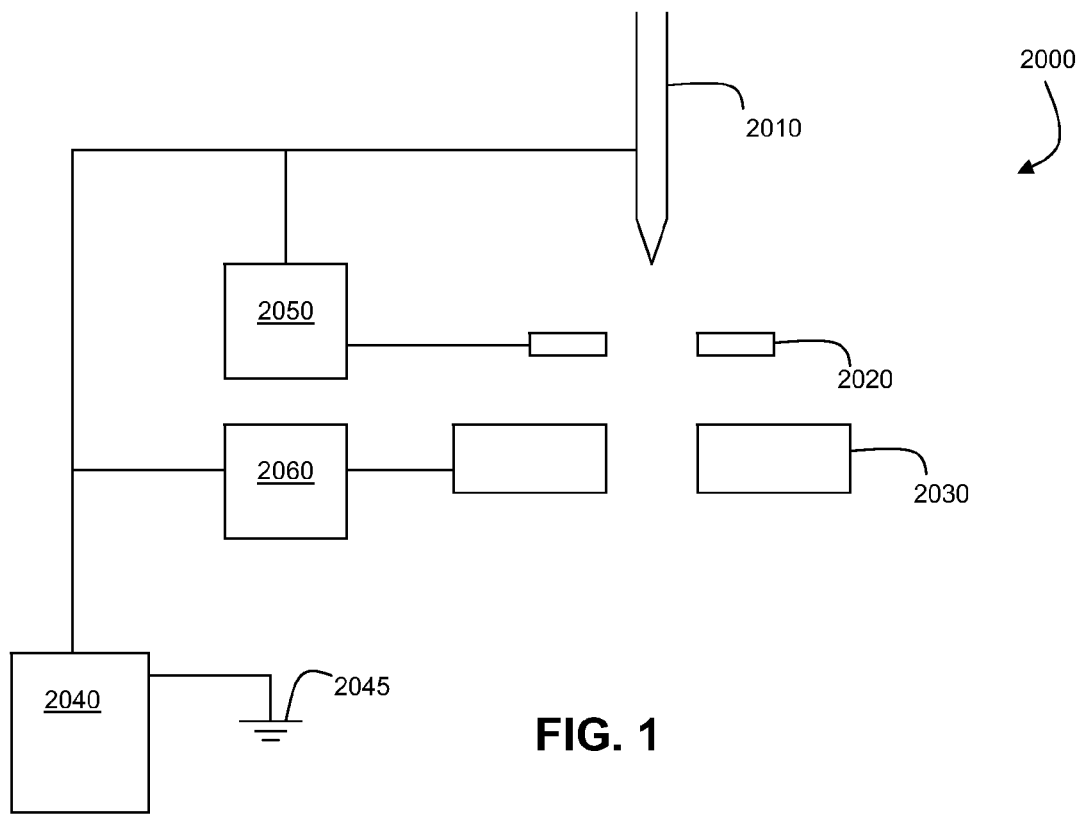
FIG. 1 is a schematic diagram of a charged particle source with a coupled power supply system.

Some charged particle systems, including scanning electron microscopes (SEMs) and gallium focused ion beams (FIBs), include a tip, a suppressor, and an extractor that together function to generate a beam of charged particles. An example of such a system is shown in FIG. 1. System 2000 includes a tip 2010, a suppressor 2020, and an extractor 2030 that are biased with different voltages that are selected to cause charged particles to leave tip 2010. As shown in FIG. 1, tip 2010, suppressor 2020, and extractor 2030 are voltage-biased in a coupled manner. For example, a first high voltage power supply 2040 is connected to tip 2010, providing a direct voltage bias to the tip. The first high voltage supply 2040 is also connected indirectly through a second high voltage power supply 2050 to suppressor 2020. The second high voltage supply 2050 modifies the voltage bias provided by the first supply 2040 and the modified voltage is applied to suppressor 2020. Further, the first high voltage supply 2040 is connected indirectly through a third high voltage power supply 2060 to extractor 2030. The third high voltage supply 2060 modifies the voltage bias provided by the first supply 2040 and the modified voltage is applied to extractor 2060. As shown in FIG. 1, power supply 2040 is connected and referenced to external electrical ground 2045.

With this coupled arrangement of power supplies, the voltage biases applied to the tip, suppressor, and extractor can be individually controlled. Further, adjustments to the first power supply 2040 cause changes to the voltages applied to each of the tip, suppressor, and extractor; each of these elements is biased in a coupled manner due to the topology of the first, second, and third power supplies. This provides an important advantage in that the operating voltages of each of the tip, suppressor, and extractor can be adjusted in tandem according to the demands of a particular charged particle emitter (e.g., tip). In particular, first power supply 2040 can be adjusted without altering the voltage differences or electric fields among tip 2010, suppressor 2020, and extractor 2030. Maintaining constant electric fields in the vicinity of tip 2010 and in other regions is generally desirable in charged particle systems, as this helps to ensure relatively constant charged particle currents. Accordingly, the arrangement of power supplies shown in FIG. 1 is commonly implemented in commercial SEMs and FIBs.

However, the arrangement of power supplies shown in FIG. 1 can be unsuitable for certain types of ion beam sources such as gas field ion sources. In a gas field ion source, the electric field near the apex of the tip (where the charged particles leave the tip) is typically about 40 volts per nanometer (in a direction pointing away from the tip). In contrast, for a typical electron-generating tip, the electric field near the tip apex is about one tenth of this value—approximately 4 volts per nanometer—and directed inward toward the tip.

Figure 2:
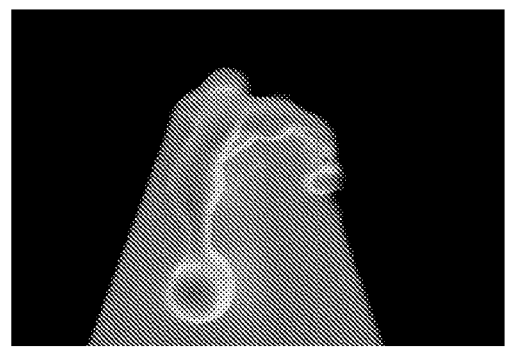
FIG. 2 is an image of a melted tip.

As a result of the relatively high electric fields near the apex, the tip in a gas field ion source can be vulnerable to changes in the voltages applied to various system components. In particular, if one of the high voltage power supplies briefly goes to ground, or an electrical arc occurs in an insulator (so that the insulator briefly becomes a conductor), then the tip in the gas field ion source can become a high current electron emitter. The large electron current emitted by the tip causes ohmic heating in the tip. Significant quantities of heat can be generated, which can lead to melting and/or vaporization of material from the tip. If the apical region of the tip becomes damaged, the tip may cease to function properly as a charged particle generator. FIG. 2 shows an example of a tip from a gas field ion source that has melted due to high current electron emission from the tip. Melting and vaporization of the tip in FIG. 2 indicates that the tip reached a temperature of approximately 3000° C., and corresponds to a dissipation of several microjoules of energy.

Typically, the tips used in gas field ion sources are very sharp; the terminal shelf of such tips can include only a small number of atoms (e.g., three atoms, five atoms, seven atoms, ten atoms). Due to this sharpness, electron emission from such tips occurs at relatively low bias voltages (e.g., from between about 1 kV to about 4 kV). Further, energy stored in the tip due to its capacitive nature—typically on the order of a few millijoules—is more than enough to vaporize a significant portion of the tip. Moreover, in gas field ion sources, many of the system components are maintained at cryogenic temperatures, including many insulating components. At such low temperatures, volatile materials can condense on the surfaces of the insulators, making the insulators more prone to electrical arcing. The high voltage insulators are also operated in the presence of relative high gas pressures (e.g., gases such as noble gases, including helium gas) that are supplied to the tip. The presence of such gases can also make electrical discharge more likely in the insulators.

Nonetheless, operation of certain types of ion sources such as gas field ion sources involves relatively high voltages that are applied to the tip to produce electric fields at the tip apex that are high enough to generate ions. As such, techniques for reducing the risk of damage to the tip while such high voltages are applied are desirable, as they increase the operating lifetime of the tip and ensure greater stability of charged particle systems during operation. The balance of this disclosure is divided into two parts. The first part discloses methods and systems that are designed to provide both variable energy and fault-tolerant operation of charged particle systems. That is, the methods and systems disclosed herein are designed to permit charged particle systems such as gas field ion systems that can both change the average energy of the charged particle beam and tolerate events such as power supply failure and/or electrical discharge without causing destruction of the tip. The discussion herein focuses on gas field ion sources, and in particular on helium gas field ion sources. However, it is to be understood that, in general, the methods and systems disclosed herein can also be used with other types of charged particle systems, including other types of ion sources, and electron sources. The second part of this disclosure discusses various aspects of gas field ion systems.

Variable Energy Gas Field Ion Systems

Figure 3:
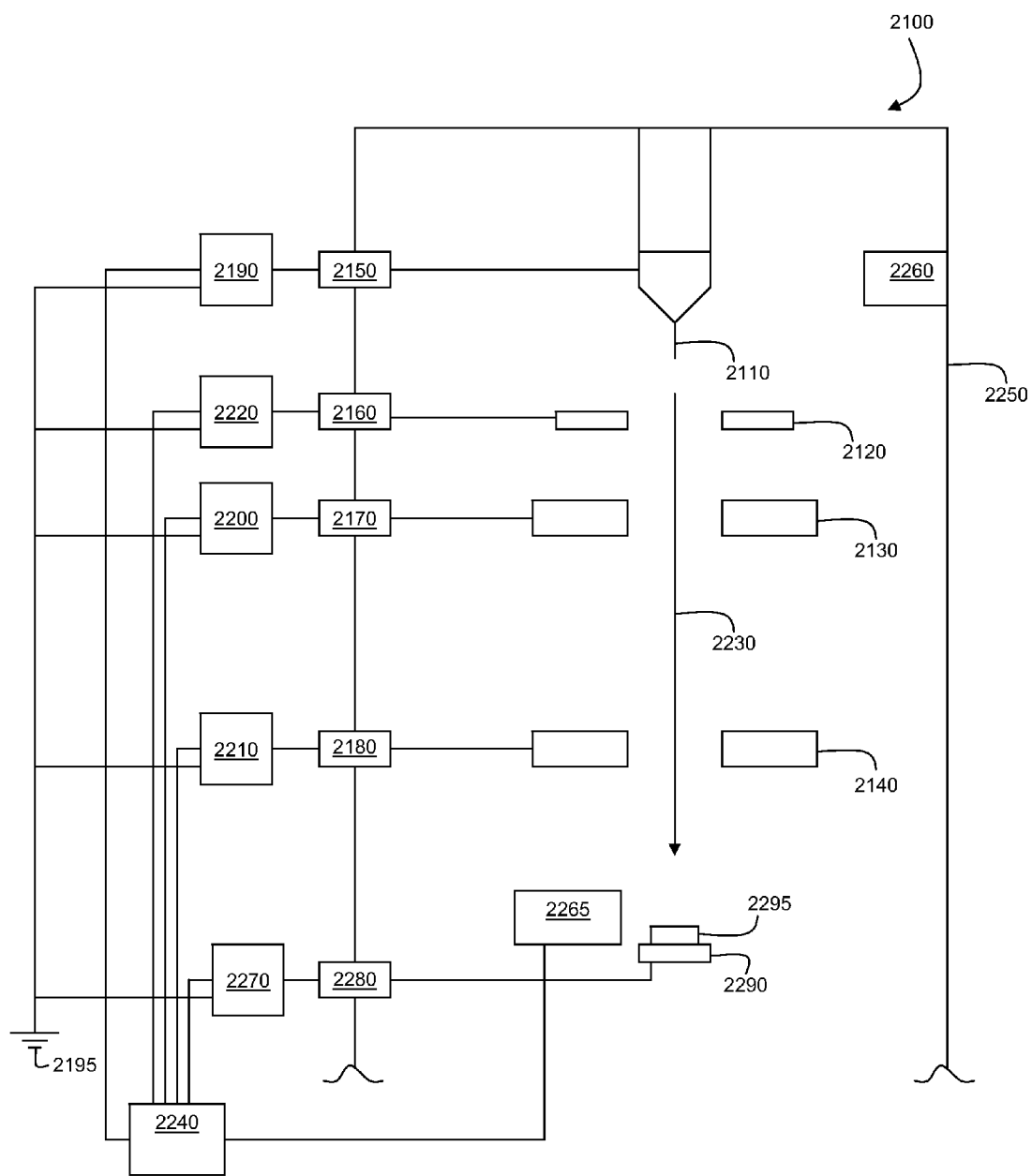
FIG. 3 is a schematic diagram of a charged particle source with a fault-tolerant power supply system.

FIG. 3 shows a schematic diagram of a gas field ion system 2100. The system includes a tip 2110, an optional suppressor 2120, an extractor 2130, and a first lens 2140. First lens 2140 is positioned adjacent to extractor 2130 along the path of charged particles 2230; that is, first lens 2140 is the first lens after extractor 2130, and is positioned before any other lens in system 2100 along the path of charged particles 2230, and after optional suppressor 2120 and extractor 2130. Each of these elements is enclosed within a housing 2250 (e.g., a vacuum chamber) and is connected through a series of high voltage feed-throughs 2150, 2160, 2170, and 2180 to a series of power supplies 2190, 2200, 2210, and 2220. System 2100 also includes a sample stage 2290 configured to support a sample 2295. Stage 2290 is connected to a power supply 2270 through high voltage feed-through 2280. Each of power supplies 2190, 2200, 2210, 2220, and 2270 is connected and referenced to a common external electrical ground 2195. An electronic processor 2240 is connected to each of the power supplies.

During operation, power supply 2190 applies a positive bias voltage (e.g., positive relative to common external ground 2195) through feed-through 2150 to tip 2110. The applied bias voltage creates an electric field pointing outward from tip 2110. Due to the sharpness of tip 2110, the electric field is particularly large in the vicinity of the tip apex. Noble gas atoms (e.g., helium atoms) are introduced into housing 2250 by gas source 2260. Some of the noble gas atoms contact the tip near the tip apex, and are ionized due to the very high electric field at the apex. Because the tip is positively biased relative to external ground 2195, the now positively-charged noble gas atoms are strongly repelled from tip 2110, and leave the tip as charged particles 2230. Charged particles 2230 pass through optional suppressor 2120, extractor 2130, and lens 2140, and then pass through further optical elements in the charged particle system (not shown in FIG. 3) before being incident on sample 2295.

Power supply 2270 can be configured to apply a voltage indirectly to sample 2295 through stage 2290, as shown in FIG. 3, or directly to sample 2295 (e.g., via a direct connection between sample 2295 and power supply 2270). The voltage applied to sample 2295 can be either positive or negative relative to external ground 2195. The difference between the voltage applied by power supply 2190 to tip 2110 and the voltage applied by power supply 2270 to sample 2295 typically determines the average energy of charged particles 2230. The larger the difference between these voltages, the larger the energy of the charged particles when they strike sample 2295.

Power supply 2200 can be configured to apply a voltage to extractor 2130. The voltage applied to extractor 2130 creates an electric field which modifies the electric field in the region of tip 2110. Because many of the properties of charged particles 2230 (including, for example, the charged particle current, the emission pattern of the charged particles from tip 2110, the energy distribution of the charged particles, and the stability of emission of charged particles from tip 2110) depend upon the electric field in the vicinity of tip 2110, these properties can be controlled by modifying the electric field via adjustments to the voltage bias applied to extractor 2130 by power supply 2200. Suppressor 2120 can, if present, provide a finer degree of control over the various properties of the charged particles and emission characteristics of tip 2110 by introducing small modifications to the electric field in the vicinity of the tip. As a result of the combined bias voltages applied to each of tip 2110, suppressor 2120, and extractor 2130, charged particles 2230 emerge from tip 2110 as a well-controlled beam that can be directed to sample 2295.

To control the average energy of charged particles 2230 as they strike sample 2295, the bias voltage applied by power supply 2190 to tip 2110 can be adjusted. Further, the bias voltage applies by power supply 2270 to sample 2295 can be adjusted. In general, the average energy of charged particles 2230 as they strike sample 2295 depends upon the difference between the voltages applied to tip 2110 and sample 2295 (both of which are referenced to common external electrical ground 2195). By adjusting either or both of the voltages applied by power supplies 2190 and 2270, the average energy of charged particles 2230 can be adjustably controlled in continuous fashion over a wide range of average particle energies.

To control the propagation properties of charged particles 2230—including the convergence or divergence of the particles—the bias voltage applied by power supply 2210 through feed-through 2180 to lens 2140 can be adjusted. In general, lens 2140 can have a wide variety of different geometries. For example, in some embodiments, lens 2140 is implemented as an Einzel lens; one or more voltages are supplied to lens 2140 to collimate, disperse, accelerate, and/or decelerate charged particles 2230 as they pass through lens 2140.

Typically, for example, a positive bias voltage is applied to lens 2140. Depending upon the magnitude of the applied voltage bias, the voltage bias either decelerates or accelerates charged particles 2230. After charged particles 2230 pass through lens 2140, the average particle energy remains relatively constant until charged particles 2230 approach sample 2295. As the charged particles approach sample 2295, they can be either accelerated or decelerated further depending upon the magnitude and sign (e.g., positive or negative relation to common ground 2195) of the voltage bias applied to sample 2295 by power supply 2270.

As shown in FIG. 3, each of power supplies 2190, 2200, 2210, 2220, and 2270 is electrically isolated from the other supplies. As used herein, two power supplies are isolated when the voltage output of one power supply is independent of the voltage output of the other power supply because the two supplies are referenced to a common electrical ground. As discussed above, tip 2110 will become a high current electron emitter—which can lead to destruction of the tip—if the bias voltage applied to tip 2110 becomes less positive (e.g., approximately 1 kV less positive for some tips) than the voltage biases applied to suppressor 2120, extractor 2130, and first lens 2140, all relative to common ground 2195. If tip 2110 has a less positive voltage bias than suppressor 2120, extractor 2130, or first lens 2140, then the electric field in the vicinity of tip 2110 points in the wrong direction; that is, the electric field points inward toward tip 2110, rather than radially outward from tip 2110. The effect of this inversion of the electric field direction is to encourage positively charged ions to propagate toward tip 2110 (or not to leave tip 2110), and to encourage negatively charged electrons to propagate away from tip 2110. Consequently, tip 2110 becomes an electron emitter. If the electric field magnitude in the vicinity of the tip is large enough, tip 2110 can become a high current electron emitter, and damage to tip 2110 (e.g., from ohmic heating, as shown in FIG. 2) can result.

The uncoupled power supply topology shown in FIG. 3 can be used to prevent inversion of the electric field in the vicinity of tip 2110. For example, the voltage supplied by power supply 2190 can be restricted to only positive values relative to ground 2195; that is, power supply 2190 can be configured to supply a positive voltage bias of between 0 V and 50 kV, for example. Further, power supplies 2200, 2210, and 2220 can be configured to provide only negative voltage biases relative to ground 2195. In such a configuration, if power supply 2190 fails—that is, power supply 2190 goes to ground—the voltage bias applied to tip 2110 goes to zero, but remains positive relative to the negative voltage biases applied to suppressor 2120, extractor 2130, and first lens 2140 by power supplies 2220, 2200, and 2210, respectively. As a result, the electric field direction in the vicinity of tip 2110 does not reverse direction, and tip 2110 does not enter an operating regime where it becomes a high current electron emitter.

Similarly, if feed-through 2150 experiences an electrical discharge event and temporarily becomes a conductor, the bias voltage applied to tip 2110 may fall to zero, but remains positive relative to the negative voltage biases applied to suppressor 2120, extractor 2130, and first lens 2140 by power supplies 2220, 2200, and 2210, respectively. Thus, the electric field in the vicinity of tip 2110 will not invert, and tip 2110 will not operate in the high current electron emission regime. Therefore, although the arrangement of power supplies shown in FIG. 3 does not permit shifting the voltage bias applied to the tip, suppressor, and extractor in tandem (e.g., as in the arrangement shown in FIG. 1), the arrangement shown in FIG. 3 reduces the likelihood of damage to tip 2110. That is, system 2100 is tolerant to the failure of any one of power supplies 2190, 2200, 2210, 2220, and 2270. Further, system 2100 is tolerant to electrical discharge events in insulators such as feed-throughs 2150, 2160, 2170, 2180, and 2280 in the system.

In contrast, system 2100 would not be fault tolerant if tip 2110 and extractor 2130 were biased in a coupled manner, as discussed in connection with FIG. 1. For example, suppose power supply 2190 was connected directly to tip 2110, and indirectly to extractor 2130 through power supply 2200. During operation of system 2100, a relatively large voltage difference is maintained between tip 2110 and extractor 2130. To apply such a difference with coupled power supplies, the voltage supplied by power supply 2190 would be a relatively large positive voltage (e.g., +50 kV relative to common ground 2195). The voltage supplied by power supply 2200 would be a negative voltage (e.g., −30 kV relative to common ground 2195) so that the modified voltage bias (due to the combination of power supplies 2190 and 2200) applied to extractor 2130 is +20 kV relative to common ground 2195. In this configuration, the large positive voltage difference between tip 2110 and extractor 2130 creates an electric field in the vicinity of tip 2110 that points radially outward from tip 2110, so that positively charged particles generated at tip 2110 are repelled and propagate away from the tip.

However, in this coupled geometry, if feed-through 2150 fails, then power supply 2190 no longer applies a voltage bias to tip 2110, and so the voltage bias of tip 2110 falls to zero relative to ground 2195. However, with feed-through 2170 intact, the voltage bias applied to extractor 2130 by the combination of power supplies 2190 and 2200 remains +20 kV relative to common ground 2195. With extractor 2130 at a higher positive voltage bias than tip 2110, the electric field direction at tip 2110 will invert, which can cause tip 2110 to become a high current electron emitter, and can lead to damage (e.g., melting, vaporization) of tip 2110. Thus, a coupled power supply arrangement does not provide the fault-tolerance that the uncoupled, isolated power supply configuration provides in FIG. 3.

Power supplies 2190, 2200, 2210, 2220, and 2270 are connected to electronic processor 2240. In certain embodiments, electronic processor 2240 can be configured to automatically adjust one or more of power supplies 2190, 2200, 2210, 2220, and 2270 to control the voltages applied to tip 2110, extractor 2130, first lens 2140, suppressor 2120, and sample 2295. In some embodiments, for example, system 2100 can include a detector 2265 positioned to measure one or more properties of charged particles 2230. Detector 2265 can communicate the measured information to processor 2240, which can adjust any one or more of power supplies 2190, 2200, 2210, 2220, and 2270 to control voltages applied to tip 2110, extractor 2130, first lens 2140, suppressor 2120, and sample 2295.

In some embodiments, for example, detector 2265 can be configured to measure information about the average energy of charged particles 2230 as they strike sample 2295. Detector 2265 can be implemented on a movable member that can be used to insert detector 2265 into the path of charged particles 2230 just before the particles strike sample 2295 to measure the average energy of the particles. Detector 2265 can include, for example, a phosphor screen configured to generate photons when a charged particle strikes the screen, and a detection element (e.g., a photodiode, a CCD device, or another device configured to detect photons) to detect the generated photons. If the number of photons produced by the phosphor screen depends upon the energy of the incoming charged particles, the photon detector can be used to measure a signal that corresponds to the average energy of charged particles 2230.

Alternatively, or in addition, in certain embodiments, detector 2265 can be positioned near to stage 2290 and sample 2295, and can be configured to measure one or more properties to infer the average energy of charged particles 2230 as they strike sample 2295. For example, detector 2265 can be configured to measure a secondary electron yield from sample 2295, and to infer the average energy of charged particles 2230 from the secondary electron yield.

Processor 2240, after receiving this information from detector 2265, can adjust voltages applied to various elements of system 2100. Thus, for example, to select a particular value of the charged particle energy, processor 2240 can adjust voltages applied to tip 2110 and/or to sample 2295. Processor 2240 can also adjust voltages applied to suppressor 2120 and/or extractor 2130 to control the electric field geometry in the vicinity of tip 2110, which can further change the average charged particle energy. Moreover, processor 2240 can adjust voltages applied to first lens 2140 (and/or suppressor 2120 and/or extractor 2130) to control the convergence and divergence properties of charged particles 2230, and/or to control various emission properties of tip 2110 (including, for example, the charged particle current, the emission pattern of the charged particles from tip 2110, the energy distribution of the charged particles, and the stability of emission of charged particles from tip 2110).

As an example, in some embodiments, a system operator can select a particular value of the average charged particle energy for a certain application, and processor 2240 can maintain the selected average charged particle energy via monitoring of the charged particles and adjustments to the applied bias voltages in system 2100. Alternatively, or in addition, in some embodiments some or all of the voltages supplied by power supplies 2190, 2200, 2210, 2220, and 2270 to tip 2110, extractor 2130, lens 2140, suppressor 2120, and sample 2295 (e.g., via stage 2290) can be controlled manually by a system operator.

In general, the initial charged particle energy (e.g., the energy of charged particles 2230 after they pass through extractor 2130) can be selected by controlling the difference between the voltages applied to tip 2110 and extractor 2130. In some embodiments, the difference between the voltages applied to tip 2110 and extractor 2130 is 5 kV or more (e.g., 10 kV or more, 15 kV or more, 20 kV or more, 25 kV or more) and/or 100 kV or less (e.g., 80 kV or less, 60 kV or less, 50 kV or less, 40 kV or less, 30 kV or less). The initial charged particle energy, in some embodiments, can be 5 keV or more (e.g., 10 keV or more, 15 keV or more, 20 keV or more, 25 keV or more) and/or 100 keV or less (e.g., 80 keV or less, 60 keV or less, 50 keV or less, 40 keV or less, 30 keV or less).

The overall charged particle average energy (e.g., the average energy of charged particles 2230 when they strike sample 2295) can be selected by controlling the voltage applied to tip 2110 and/or sample 2295. Because the voltage applied to tip 2110 and/or sample 2295 (e.g., via power supplies 2190 and/or 2270) is continuously adjustable, a wide range of different overall average charged particle energies can be selected. In some embodiments, for example, the overall charged particle average energy is 100 keV or less (e.g., 80 keV or less, 60 keV or less, 50 keV or less, 40 keV or less, 30 keV or less, 20 keV or less, 10 keV or less, 5 keV or less, 3 keV or less, 2 keV or less).

Typically, the voltage applied to tip 2110 is positive relative to the common external electrical ground. For example, in some embodiments, the applied voltage is 10 kV or more (e.g., 15 kV or more, 20 kV or more, 30 kV or more, 40 kV or more, 50 kV or more, 60 kV or more, 80 kV or more, 100 kV or more). The voltage applied to extractor 2130 can be negative or positive relative to the common electrical ground. For example, in certain embodiments, the magnitude of the voltage applied to extractor 2130 is 1 kV or more (e.g., 2 kV or more, 5 kV or more, 10 kV or more, 15 kV or more, 20 kV or more, 30 kV or more, 40 kV or more, 50 kV or more).

A variety of different types of charged particle beams can be produced in system 2100. In some embodiments, for example, charged particles 2230 include ions. The ions can be noble gas ions, for example. Suitable noble gas ions include helium ions, argon ions, neon ions, and krypton ions. In certain embodiments, other types of ion beams can also be produced. Further, as discussed above, the systems disclosed herein are not restricted to ion beams. Other types of charged particle systems such as electron beam sources and systems can be operated in the fault tolerant configurations disclosed herein so that the likelihood of tip destruction due to high-current electron emission can be reduced or eliminated.

Ion Beam Sources and Systems

Figure 4:
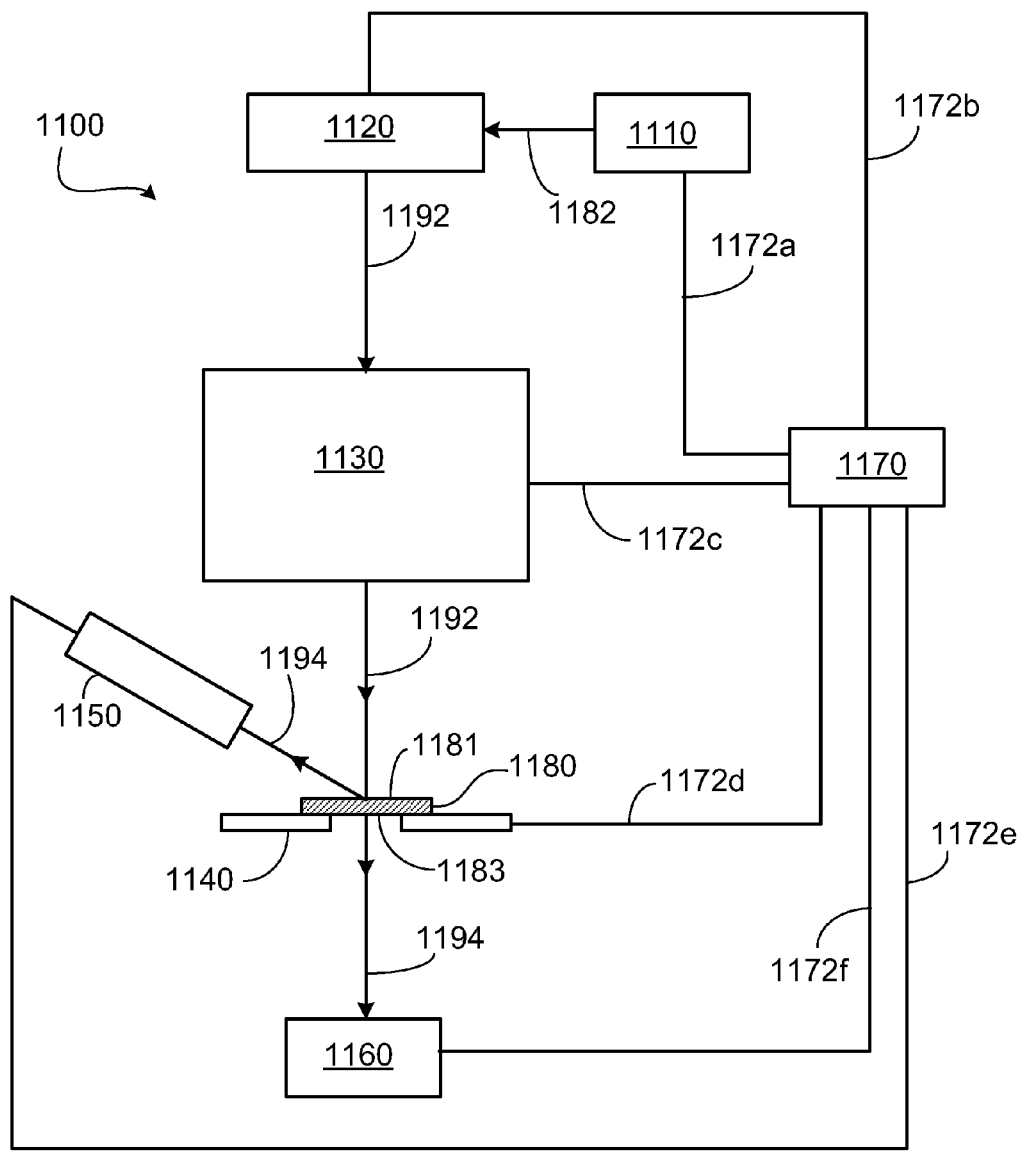
FIG. 4 is schematic diagram of an ion microscope system.

While FIG. 3 shows a highly schematic representation of a gas field ion microscope system, FIG. 4 shows a schematic, but somewhat more detailed, representation of a gas field ion microscope system 1100 that includes a gas source 1110, a gas field ion source 1120, ion optics 1130, a sample manipulator 1140, a front-side detector 1150, a back-side detector 1160, and an electronic control system 1170 (e.g., an electronic processor, such as a computer) electrically connected to various components of system 1100 via communication lines 1172a-1172f. A sample 1180 is positioned in/on sample manipulator 1140 between ion optics 1130 and detectors 1150, 1160.

Figure 5:
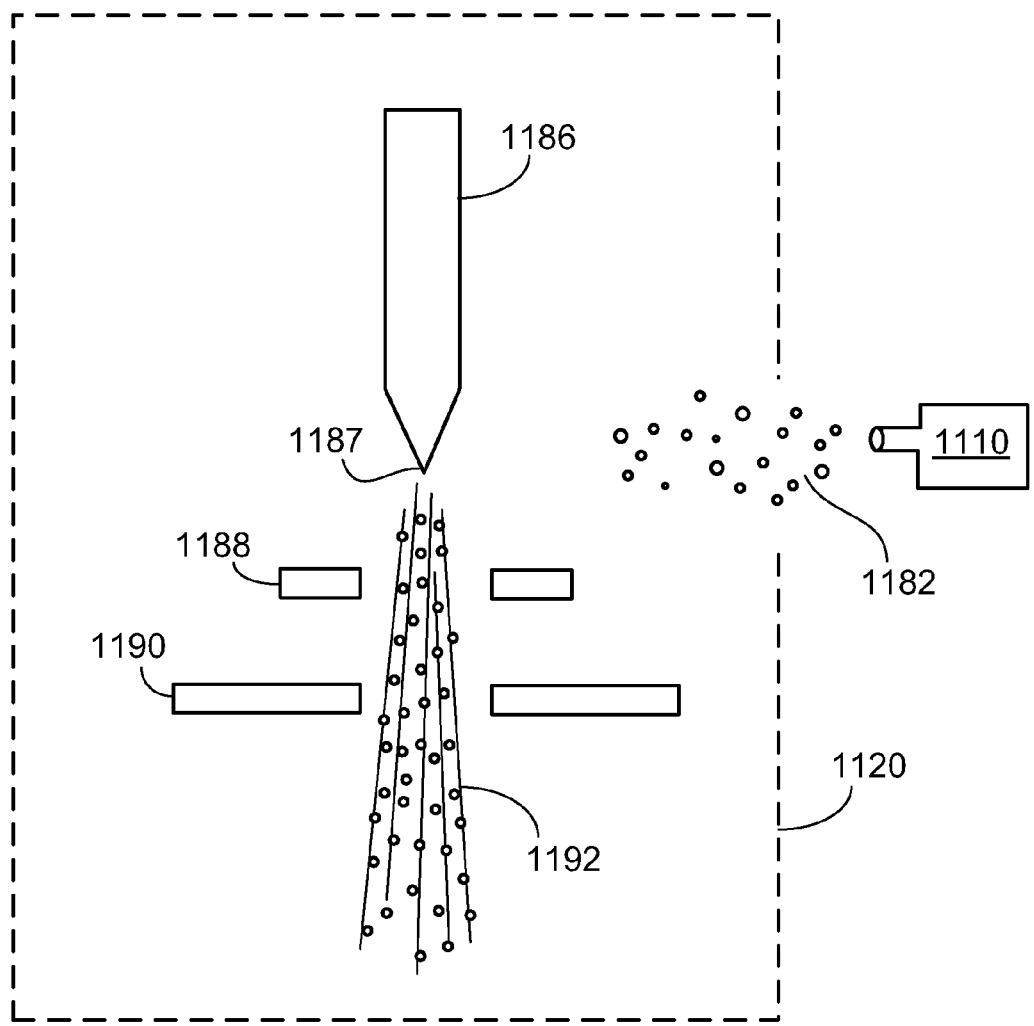
FIG. 5 is a schematic diagram of a gas field ion source.

During use, an ion beam 1192 is directed through ion optics 1130 to a surface 1181 of sample 1180, and particles 1194 resulting from the interaction of ion beam 1192 with sample 1180 are measured by detectors 1150 and/or 1160. In general, it is desirable to reduce the presence of certain undesirable chemical species in system 100 by evacuating the system. As shown in FIG. 5, gas source 1110 is configured to supply one or more gases (e.g., He, Ne, Ar, Kr, Xe) 1182 to gas field ion source 1120. Gas field ion source 1120 is configured to receive the one or more gases 1182 from gas source 1110 and to produce gas ions from gas(es) 1182. Gas field ion source 1120 includes a tip 1186 with a tip apex 1187, an extractor 1190 and optionally a suppressor 1188.

During use, tip 1186 is biased positively with respect to extractor 1190, extractor 1190 is negatively or positively biased with respect to an external ground, and optional suppressor 1188 is biased positively or negatively with respect to tip 1186. With this configuration, un-ionized gas atoms 1182 supplied by gas source 1110 are ionized and become positively-charged ions in the vicinity of tip apex 1187. The positively-charged ions are simultaneously repelled by positively charged tip 1186 and attracted by negatively charged extractor 1190 such that the positively-charged ions are directed from tip 1186 into ion optics 1130 as ion beam 1192. Suppressor 1188 assists in controlling the overall electric field between tip 1186 and extractor 1190 and, therefore, the trajectories of the positively-charged ions from tip 1186 to ion optics 1130. In general, the overall electric field between tip 1186 and extractor 1190 can be adjusted to control the rate at which positively-charged ions are produced at tip apex 1187, and the efficiency with which the positively-charged ions are transported from tip 1186 to ion optics 1130.

In general, ion optics 1130 are configured to direct ion beam 1192 onto surface 1181 of sample 1180. First lens 2140, shown in FIG. 3, is typically the first optical element in ion optics 1130, and is positioned so that the ions in beam 1192 pass initially through first lens 2140 when they enter ion optics 1130. Ion optics 1130 can, for example, focus, collimate, deflect, accelerate, and/or decelerate ions in beam 1192. Ion optics 1130 can also allow only a portion of the ions in ion beam 1192 to pass through ion optics 1130. Generally, ion optics 1130 include a variety of electrostatic and other ion optical elements that are configured as desired. By manipulating the electric field strengths of one or more components (e.g., electrostatic deflectors) in ion optics 1130, He ion beam 1192 can be scanned across surface 1181 of sample 1180. For example, ion optics 1130 can include two deflectors that deflect ion beam 1192 in two orthogonal directions. The deflectors can have varying electric field strengths such that ion beam 1192 is rastered across a region of surface 1181.

When ion beam 1192 impinges on sample 1180, a variety of different types of particles 1194 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 1150 and 1160 are positioned and configured to each measure one or more different types of particles resulting from the interaction between He ion beam 1192 and sample 1180. As shown in FIG. 4, detector 1150 is positioned to detect particles 1194 that originate primarily from surface 1181 of sample 1180, and detector 1160 is positioned to detect particles 1194 that emerge primarily from surface 1183 of sample 1180 (e.g., transmitted particles).

In general, a wide variety of different detectors can be employed in microscope system 1100 to detect different particles, and a microscope system 1100 can typically include any desired number of detectors. The configuration of the various detector(s) can be selected in accordance with particles to be measured and the measurement conditions. Generally, the information measured by the detectors is used to determine information about sample 1180. Typically, this information is determined by obtaining one or more images of sample 1180. The operation of microscope system 1100 is generally controlled via electronic control system 1170. For example, electronic control system 1170 can be configured to control the gas(es) supplied by gas source 1110, the temperature of tip 1186, the electrical potential of tip 1186, the electrical potential of extractor 1190, the electrical potential of suppressor 1188, the settings of the components of ion optics 1130, the position of sample manipulator 1140, and/or the location and settings of detectors 1150 and 1160.

Optionally, one or more of these parameters may be manually controlled (e.g., via a user interface integral with electronic control system 1170). Additionally or alternatively, electronic control system 1170 can be used (e.g., via an electronic processor, such as a computer) to analyze the information collected by detectors 1150 and 1160 and to provide information about sample 1180, which can optionally be in the form of an image, a graph, a table, a spreadsheet, or the like. Typically, electronic control system 1170 includes a user interface that features a display or other kind of output device, an input device, and a storage medium.

Other aspects of the sources and systems discussed herein are disclosed, for example, in U.S. Pat. No. 7,504,639, the entire contents of which are incorporated herein by reference.

Computer Hardware and Software

In general, any of the methods described above can be implemented in computer hardware or software, or a combination of both. The methods can be implemented in computer programs using standard programming techniques following the methods and figures described herein. Program code is applied to input data to perform the functions described herein and generate output information. The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The methods can also be implemented as a computer-readable storage medium, configured with a computer program, where the storage medium so configured causes a computer to operate in a specific and predefined manner to perform the functions described herein.

OTHER EMBODIMENTS

Other embodiments are in the claims.

What is claimed is:

1. A gas field ion system, comprising:
a first voltage source connected to and referenced to an electrical ground;
a second voltage source connected to and referenced to the electrical ground, a voltage output of the second voltage source being independent of a voltage output of the first voltage source;
a gas field ion source comprising a tip having a tip apex, the gas field ion source being electrically connected to the first voltage source so that the first voltage source is configured to apply a first voltage to the gas field ion source relative to the electrical ground; and
an extractor electrically connected to the second voltage source so that the second voltage source is configured to apply a second voltage to the extractor relative to the electrical ground,
wherein, during use of the gas field ion system, the second voltage is always negative relative to the electrical ground.

2. The gas field ion system of claim 1, further comprising:
a third voltage source connected to and referenced to the electrical ground, a voltage output of the third voltage source being independent of the voltage outputs of the first and second voltage sources; and
a sample stage electrically connected to the third voltage source,
wherein, during use of the gas field ion system, a plurality of ions having a first average energy leaves the tip; and
wherein the third voltage source is configured to apply a third voltage to a sample positioned on the sample stage so that, during use of the gas field ion system, the ions have a second average energy different from the first average energy when they are incident on the sample.

3. The gas field ion system of claim 2, wherein the third voltage is selected so that the second average energy is less than the first average energy.

4. The gas field ion system of claim 1, wherein, during use of the gas field ion source, the first voltage is positive relative to the electrical ground.

5. The gas field ion system of claim 1, further comprising:
a third voltage source connected to and referenced to the electrical ground; and
a lens electrically connected to the third voltage source so that the third voltage source is configured to apply a third voltage to the lens relative to the electrical ground, wherein:
during use of the gas field ion system, a beam of ions follow a path through the gas field ion system;
the lens is a first lens after the extractor along the path of the beam of ions; and
the third voltage is different from the second voltage.

6. The gas field ion system of claim 1, wherein the first and second voltages are selected so that an electric field in the vicinity of the gas field ion source is directed radially outward from the gas field ion source.

7. The gas field ion system of claim 2, further comprising an electronic processor connected to the third voltage source and configured to select the third voltage.

8. The gas field ion system of claim 7, further comprising a detector connected to the electronic processor and configured to determine an average energy of the ions when they are incident on the sample.

9. The gas field ion system of claim 7, wherein the electronic processor is configured to select the third voltage based on the determined average energy of the ions.

10. The gas field ion system of claim 1, wherein the gas field ion source is configured to produce a plurality of ions.

11. The gas field ion system of claim 1, wherein the first and second voltage sources are configured so that during operation of the gas field ion system, if the magnitude of one of the first or second voltages is reduced, the gas field source does not emit electrons.

12. The gas field ion system of claim 1, wherein the first and second voltage sources are configured so that during operation of the gas field ion system, if the magnitude of one of the first or second voltages is reduced to zero, the gas field source does not emit electrons.

13. The gas field ion system of claim 1, wherein the first and second voltage sources are configured so that during operation of the gas field ion system, if the magnitude of one of the first or second voltages is reduced, the gas field source does not melt or vaporize.

14. The gas field ion system of claim 1, wherein the first and second voltage sources are configured so that during operation of the gas field ion system, if the magnitude of one of the first or second voltages is reduced, an electric field in the vicinity of the gas field source remains directed away from the gas field source.

15. The gas field ion system of claim 1, wherein the first and second voltage sources are configured so that during operation of the gas field ion system, if the magnitude of one of the first or second voltages is reduced, a voltage of the gas field source remains positive relative to a voltage of the extractor.

16. A method, comprising:
providing a gas field ion system, comprising:
a gas field ion source comprising a tip having a tip apex;
an extractor;
a first voltage source; and
a second voltage source;
operating the gas field ion system in a first mode which comprises:
applying a first voltage from the first voltage source to the gas field ion source, the first voltage source being referenced to and connected to an electrical ground; and
applying a second voltage from the second voltage source to the extractor, the second voltage source being referenced to and connected to the electrical ground, a voltage output of the second voltage source being independent of a voltage output of the first voltage source; and
operating the gas field ion system in a second mode which comprises:
electrically connecting the gas field ion source to ground; and
applying a third voltage to the extractor, the third voltage being negative relative to the electrical ground,
wherein:
the second voltage is always less positive than the first voltage relative to the electrical ground; and the first and second voltages are selected to generate a plurality of ions and to cause the plurality of ions to leave the gas field ion source when the gas field ion system is operated in the first mode.

17. The method of claim 16, wherein the ions have a first average energy when they leave the gas field source, the method further comprising applying a third voltage from a third voltage source to a sample so that the ions have a second average energy different from the first average energy when they are incident on the sample.

18. The method of claim 17, wherein the second average energy is less than the first average energy.

19. The method of claim 17, wherein the third voltage source is connected to and referenced to the electrical ground, and a voltage output of the third voltage source is independent of voltage outputs of the first and second voltage sources.

20. The method of claim 16, wherein the second voltage is negative relative to the electrical ground.

21. The method of claim 16, wherein the first and second voltages are selected so that an electric field in the vicinity of the gas field source is directed radially outward from the gas field ion source.

22. The method of claim 17, further comprising determining an average energy of the ions when they are incident on the sample, and selecting the third voltage based on the determination of the average energy.

23. The method of claim 16, wherein a difference between the first and second voltages is 15 kV or more.

24. The method of claim 17, wherein the second average energy is 15 keV or less.

25. A method, comprising:
providing a gas field ion system, comprising:
a gas field ion source comprising a tip having a tip apex;
an extractor;
a first voltage source; and
a second voltage source;
applying a first voltage from the first voltage source to the gas field ion source, the first voltage source being referenced to and connected to an electrical ground; and
applying a second voltage from the second voltage source to the extractor, the second voltage source being referenced to and connected to the electrical ground, a voltage output of the second voltage source being independent of a voltage output of the first voltage source,
wherein during the method:
the second voltage is negative relative to the electrical ground; and
the first and second voltages are selected to control one or more properties of ions generated by the gas field source.

26. The method of claim 25, wherein the one or more properties comprise at least one member selected from the group consisting of an ion current, an emission pattern of the ions from the gas field ions source, and an energy distribution of the ions.

27. The method of claim 25, wherein:
the gas field system further comprises:
a third voltage source connected to and referenced to the electrical ground; and
a lens electrically connected to the third voltage source;
the method further comprises:
using the third voltage source to apply a third voltage to the lens relative to the electrical ground, the third voltage being different from the second voltage; and
using the gas field ion system to form a beam of ions which follow a path through the gas field ion system; and
the lens is a first lens after the extractor along the path of the beam of ions.

28. The method of claim 25, further comprising selecting the first and second voltages so that an electric field in the vicinity of the gas ion field ion source is directed radially outward from the gas ion field source.

29. The method of claim 28, further comprising selecting the first and second voltages so that the electric field in the vicinity of the gas ion field ion source remains directed radially outward if a magnitude of one of the first and second voltages is reduced due to a failure of one or the first and second voltage sources or due to a failure of an electrical insulator.

* * * * *

UNITED STATES PATENT AND TRADEMARK OFFICE
CERTIFICATE OF CORRECTION

PATENT NO.        : 8,766,210 B2                              Page 1 of 1
APPLICATION NO.   : 13/328326
DATED             : July 1, 2014
INVENTOR(S)       : Raymond Hill and John A. Notte, IV It is certified that error appears in the above-identified patent and that said Letters Patent is hereby corrected as shown below:

In the Claims

Col. 16, line 32, delete "ion field" and insert --field ion--.

Signed and Sealed this
Sixteenth Day of September, 2014

Michelle K. Lee
*Deputy Director of the United States Patent and Trademark Office*